United States Patent
Jain et al.

(10) Patent No.: US 12,556,188 B2
(45) Date of Patent: Feb. 17, 2026

(54) ANALOG-TO-DIGITAL CONVERTER (ADC) CLOCK PHASE CONTINUITY ACROSS USER EQUIPMENT MICROSLEEP MODE

(71) Applicant: QUALCOMM Incorporated, San Diego, CA (US)

(72) Inventors: Vinay Jain, Bengaluru (IN); Sunil Babu Javaji, Bangalore (IN); Shat Prateek, Agra (IN)

(73) Assignee: QUALCOMM Incorporated, San Diego, CA (US)

( * ) Notice: Subject to any disclaimer, the term of this patent is extended or adjusted under 35 U.S.C. 154(b) by 166 days.

(21) Appl. No.: 18/463,812

(22) Filed: Sep. 8, 2023

(65) Prior Publication Data

US 2025/0088194 A1    Mar. 13, 2025

(51) Int. Cl.
| | |
|---|---|
| *H03L 7/085* | (2006.01) |
| *H03L 7/081* | (2006.01) |
| *H03L 7/18* | (2006.01) |
| *H03M 1/12* | (2006.01) |
| *H03K 17/22* | (2006.01) |

(52) U.S. Cl.
CPC .............. *H03L 7/085* (2013.01); *H03L 7/081* (2013.01); *H03L 7/18* (2013.01); *H03M 1/12* (2013.01); *H03K 17/22* (2013.01)

(58) Field of Classification Search
CPC ..... G06F 1/04; G06F 1/12; G06F 1/24; G06F 11/00; H03K 5/00; H03K 5/26; H03K 21/10; H03L 7/00; H03L 7/06; H03L 7/08; H03L 7/10; H03L 7/18; H03L 7/24; H03L 7/081; H03L 7/085; H03L 7/099; H03M 1/12

USPC ....... 327/115, 117, 141, 156, 158, 208, 234; 375/219, 316, 354, 355, 371, 375, 376; 713/300, 400, 500, 503

See application file for complete search history.

(56) References Cited

U.S. PATENT DOCUMENTS

| | | |
|---|---|---|
| 6,473,476 B1 | 10/2002 | Banks |
| 8,812,893 B1 | 8/2014 | Venkata et al. |
| 10,491,222 B2 * | 11/2019 | Parekh .................... H03L 7/183 |
| 2005/0231244 A1 | 10/2005 | Hartfiel et al. |

(Continued)

OTHER PUBLICATIONS

International Search Report and Written Opinion—PCT/US2024/041920—ISA/EPO—Nov. 28, 2024.

*Primary Examiner* — Shawkat M Ali
(74) *Attorney, Agent, or Firm* — Loza & Loza, LLP/Qualcomm Incorporated

(57) ABSTRACT

An apparatus, including: a first synchronizer configured to synchronize a frequency divider reset signal with a reference clock signal to generate a reference clock domain reset signal; a set of delay buffers configured to generate a set of delayed staggered reference clock domain reset signals based on the reference clock domain reset signal; a set of second synchronizers configured to synchronize the set of delayed staggered reference clock domain reset signals with a phase lock loop (PLL) clock signal to generate a set of PLL clock domain reset signals; a phase detector configured to generate a signal related to a phase difference between respective clocking edges of the reference clock signal and the PLL clock signal; a phase corrector configured to generate a select signal based on the phase difference signal; and a multiplexer configured to output one of the PLL clock domain reset signals based on the select signal.

22 Claims, 10 Drawing Sheets

(56) References Cited

U.S. PATENT DOCUMENTS

| | | | |
|---|---|---|---|
| 2015/0364170 A1* | 12/2015 | Clovis | G11C 29/028 |
| | | | 365/189.05 |
| 2022/0187887 A1 | 6/2022 | Kimura et al. | |
| 2024/0154617 A1* | 5/2024 | J | H03L 7/16 |

* cited by examiner

ANALOG-TO-DIGITAL CONVERTER (ADC) CLOCK PHASE CONTINUITY ACROSS USER EQUIPMENT MICROSLEEP MODE

FIELD

Aspects of the present disclosure relate generally to user equipment (UE), and in particular, to a technique of maintaining analog-to-digital converter (ADC) phase continuity across microsleep operation mode in a UE.

BACKGROUND

A user equipment (UE) may receive a downlink (DL) signal from a base station that may or may not include user data intended for the UE. The DL signal may include a first portion informing the UE whether there is user data for the UE, and a second portion including the user data if present. If the first portion of the DL signal indicates that there is no user data for the UE, the UE may operate in a lower power mode (LPM) during the second portion of the DL signal in order to conserve power.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes: a first synchronizer configured to synchronize a frequency divider reset signal with a reference clock signal or a frequency divided reference clock signal to generate a reference clock domain frequency divider reset signal; a set of delay buffers configured to generate a set of delayed staggered reference clock domain frequency divider reset signals based on the reference clock domain frequency divider reset signal; a set of second synchronizers configured to synchronize the set of delayed staggered reference clock domain frequency divider reset signals with a phase lock loop (PLL) clock signal to generate a set of PLL clock domain frequency divider reset signals; a phase detector configured to generate a phase difference signal related to a phase difference between respective clocking edges of the reference clock signal and the PLL clock signal; a phase corrector configured to generate a select signal based on the phase difference signal; and a multiplexer configured to output one of the set of PLL clock domain frequency divider reset signals based on the select signal.

Another aspect of the disclosure relates to an apparatus. The apparatus includes: a first synchronizer including a data input configured to receive a frequency divider reset signal and a clock input configured to receive a reference clock signal or a frequency divided reference clock signal; a set of delay buffers including inputs coupled to an output of the first synchronizer; a set of second synchronizers including data inputs coupled to the outputs of the first synchronizer and the set of delay buffers, respectively, and clock inputs configured to receive a phase lock loop (PLL) clock signal; a phase detector including inputs coupled to outputs of the set of second synchronizers, respectively; a phase corrector including an input coupled to an output of the phase detector; a multiplexer including inputs coupled to the outputs of the set of second synchronizers, respectively, and a select input coupled to an output of the phase corrector; and a frequency divider including a reset input coupled to an output of the multiplexer.

Another aspect of the disclosure relates to an apparatus. The apparatus includes: a first synchronizer configured to synchronize a frequency divider reset signal with a reference clock signal or a frequency divided reference clock signal to generate a reference clock domain frequency divider reset signal; a phase detector configured to generate a signal related to a phase difference between clocking edges of the reference clock signal and a phase lock loop (PLL) clock signal; a phase corrector configured to select or generate a delayed reference clock domain frequency divider reset signal based on the phase difference signal; and a second synchronizer configured to synchronize the delayed reference clock domain frequency divider reset signal with the PLL clock signal to generate a PLL clock domain frequency divider reset signal.

Another aspect of the disclosure relates to a method. The method includes: synchronizing a frequency divider reset signal with a reference clock signal or a frequency divided reference clock signal to generate a reference clock domain frequency divider reset signal; generating a signal related to a phase difference between clocking edges of the reference clock signal and a phase lock loop (PLL) clock signal; selecting or generating a delayed reference clock domain frequency divider reset signal based on the phase difference signal; and synchronizing the delayed reference clock domain frequency divider reset signal with the PLL clock signal to generate a PLL clock domain frequency divider reset signal.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
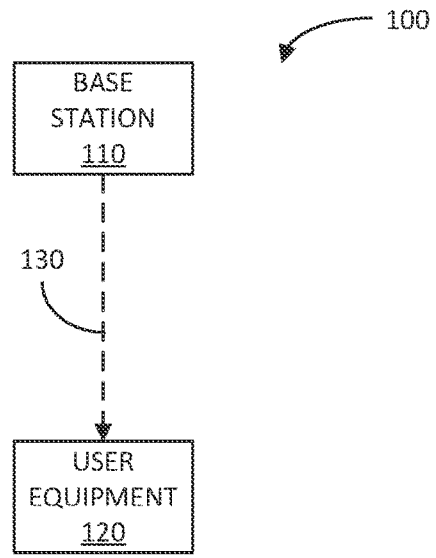
FIG. 1 illustrates a block diagram of an example wireless communication system in accordance with an aspect of the disclosure.

FIG. 1 illustrates a block diagram of an example wireless communication system 100 in accordance with an aspect of the disclosure. The wireless communication system 100 includes a base station (BS) 110 and a user equipment (UE) 120 (e.g., a mobile phone, wireless device, personal computer, laptop, tablet device, network device, wearable device, health monitoring/treatment device, Internet of Things (IoT), etc.). Although a single base station 110 and a single user equipment 120 are shown for ease of description, it shall be understood that the wireless communication system 100 may (and typically does) include a plurality of base stations and a plurality of user equipment.

In this example, the base station 110 and the user equipment 120 are communicating with each other via a downlink (DL) communication link 130. It shall be understood that there may be other communication links between the base station 110 and the user equipment 120, such as one or more uplink (UL) communication links, one or more secondary cell communication links as in a carrier aggregation (CA) scenario, and simultaneously UL and DL communication links as in an Evolved Universal Terrestrial Radio Access (E-UTRAN) New Radio-Dual Connectivity (ENDC) scenario. As mentioned, the communication link 130 may be in compliance with many different protocols, such as Long-Term Evolution (LTE), Fifth Generation New Radio (5G NR) developed by $3^{rd}$ Generation Partnership Project (3GPP), and others.

Figure 2:
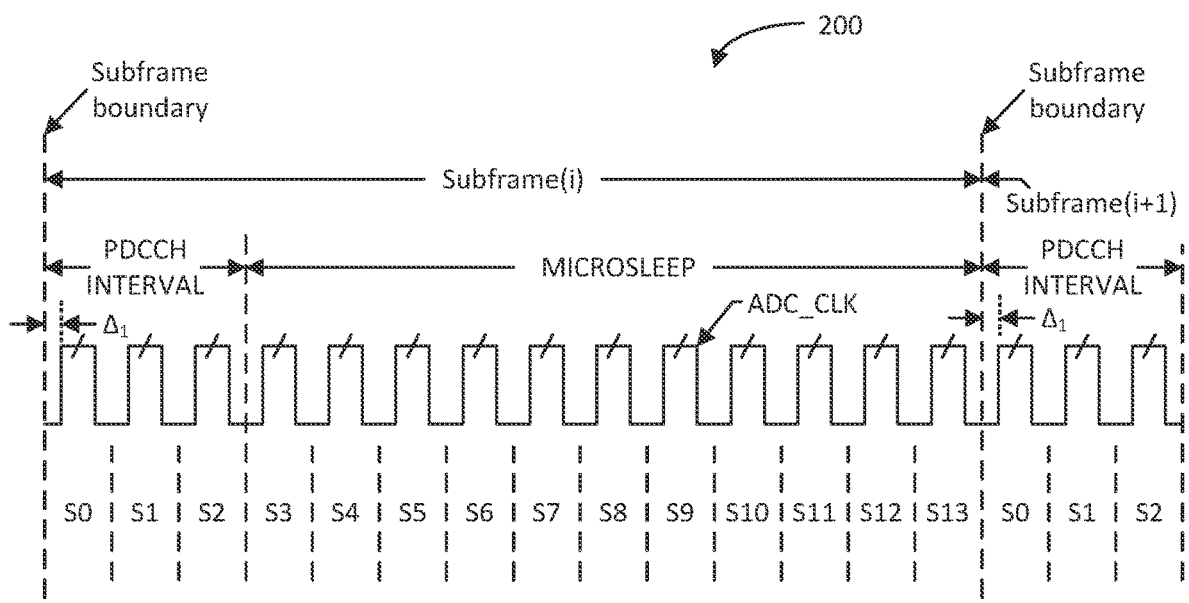
FIG. 2 illustrates a timing diagram of an example downlink (DL) signal in accordance with another aspect of the disclosure.

FIG. 2 illustrates a timing diagram of an example downlink (DL) signal 200 in accordance with another aspect of the disclosure. The DL signal 200 may be an example signal transmitted by the base station 110 to the user equipment 120 via the DL communication link 130. In this example, the DL signal 200 may include a set of consecutive subframes, where an $i^{th}$ subframe(i) and a following partial $(i+1)^{th}$ subframe(i+1) are illustrated. In accordance with the LTE and 5G NR protocols, each subframe may have a time length of (1) millisecond (ms). Each subframe may include a set of 14 symbol intervals S0 to S13 for transmission of DL data. Although not illustrated, the DL data may also be sent via a set of different frequency channels.

The DL signal 200 may include control data for the user equipment 120 in the first three symbol intervals S0 to S2 of the subframe sent via a physical downlink control channel (PDCCH). The control data in the PDCCH informs the user equipment 120 whether there is user data for the user equipment 120 in one or more of the remaining symbol intervals S3 to S13 sent via a physical downlink shared control channel (PDSCH). The first three symbol intervals S0 to S2 may have a cumulative time length of 215 microseconds (s), and the remaining symbol intervals S3 to S13 of the subframe may have a time length of 785 μs. As shown, continuously following the last symbol interval S13 of the $i^{th}$ subframe(i) is the first symbol interval S0 of the $(i+1)^{th}$ subframe(i+1), and the subframes are repeated accordingly.

In many subframes, there may not be any user data in the PDSCH for the user equipment 120. Accordingly, the user equipment 120 may save power during symbol intervals S3 to S13 of each subframe as the user equipment 120 need not receive and process any signal during such time. Accordingly, the user equipment 120 may reconfigure itself in a microsleep mode, where it disables or places one or more receiver components in a low power mode (LPM). When existing the microsleep mode at substantially the end of the last symbol interval S13 of the subframe, the user equipment 120 wake ups and enables or reconfigures the one or more receiver components to operational mode to receive the PDCCH control data in the first three symbol intervals S0 to S2 of the next subframe.

One such receiver component that may be disabled or placed in LPM during microsleep for power saving purposes is the clock signal ADC_CLK for driving an analog-to-digital converter (ADC) for converting a received analog signal into a digital signal. That is, the ADC samples and digitizes the received DL signal 200 within each of the symbol intervals S0 to S13 at a sampling rate dictated by the clock signal ADC_CLK. The phase relationship of the clock signal ADC_CLK with respect to the symbol intervals should be kept substantially constant from subframe to subframe so that the PDCCH data signal (as well as the PDSCH data signal if present) is properly sampled and digitized by the ADC. Accordingly, if the ADC clock signal generator is placed in microsleep during symbol intervals S3 to S13, the clock signal ADC_CLK should wake up with the same phase $\Delta_1$ with respect to the subframe boundary for each subframe; or said differently, as if the ADC clock signal generator had never been turned off. In FIG. 2, the constant phase relationship between the clock signal ADC_CLK and the symbol intervals are shown (although, for simplicity's sake, there may be many periods of the clock signal ADC_CLK in each symbol interval, instead of one (1) as depicted in FIG. 2).

Figure 3:
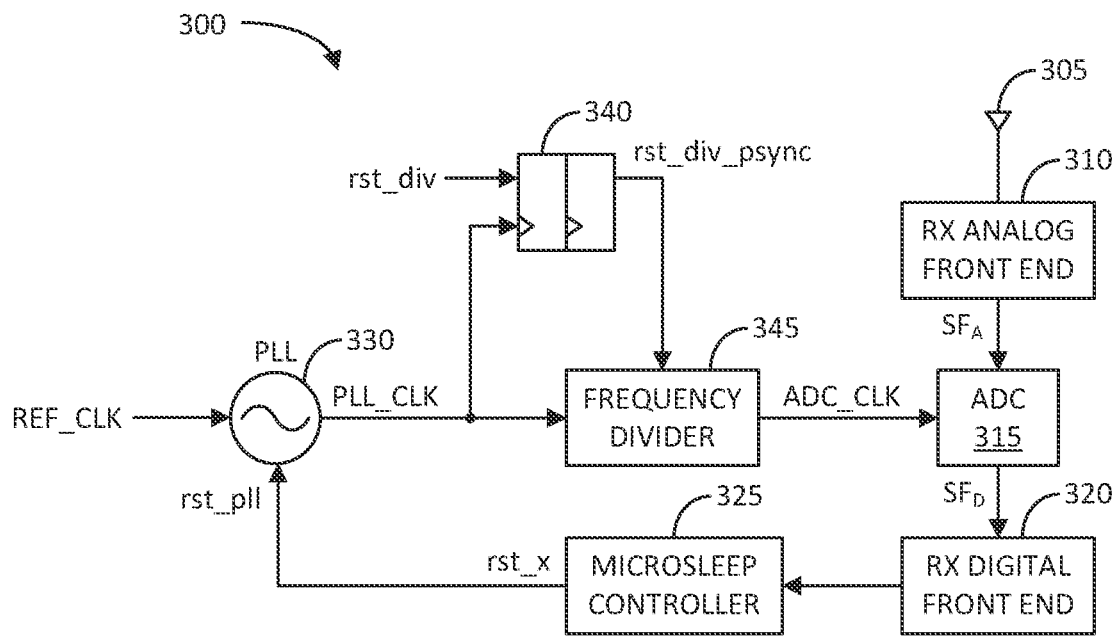
FIG. 3 illustrates a block diagram of an example receiver front end of a user equipment (UE) in accordance with another aspect of the disclosure.

FIG. 3 illustrates a block diagram of an example receiver front end 300 of a user equipment (UE) in accordance with another aspect of the disclosure. For example, the receiver front end 300 may be implemented in user equipment 120 previously discussed. In this regard, the receiver front end 300 may be configured to receive and digitize the DL signal 200 previously discussed.

In particular, the receiver front end 300 includes at least one antenna 305, a receiver (Rx) analog front end 310 including an input coupled to the at least one antenna 305, an analog-to-digital converter (ADC) 315 including a signal input coupled to an output of the Rx analog front end 310, and a Rx digital front end 320 including an input coupled to an output of the ADC 315. The receiver front end 300 further includes a phase lock loop (PLL) 330 configured to receive a reference clock signal REF_CLK (e.g., generated by a crystal oscillator) and generate a PLL clock signal PLL_CLK based on (e.g., phase locked to) the reference clock signal REF_CLK. The receiver front end 300 further includes a frequency divider 345 configured to frequency divide (e.g., by two (2)) the PLL clock signal PLL_CLK to generate an ADC clock signal ADC_CLK. The frequency divider 345 includes an output coupled to a clock input of the ADC 315 to provide the ADC clock signal ADC_CLK thereto. As previously mentioned, the ADC 315 is configured to sample and digitize a DL analog signal (subframes) $SF_A$ generated by the Rx analog front end 310 to generate a DL digital signal (subframes) $SF_D$ based on the clock signal ADC_CLK. The DL analog signal $SF_A$ may be based on a radio frequency (RF) signal received from the base station 110 via the at least one antenna 305. The Rx digital front end processes the DL digital signal (subframes) $SF_D$ to decode the PDCCH data and PDSCH data if present.

For implementing microsleep mode as previously discussed, the receiver front end 300 may include a microsleep controller 325, which may be responsive to the Rx digital front end 320. The microsleep controller 325 may generate a reset signal rst_x for the PLL 330 (e.g., rst_pll, where x=pll) to selectively disable or place it in LPM during microsleep. The microsleep controller 325 may also generate a reset signal rst_x for the frequency divider 345 (e.g., rst_div, where x=div) to selectively disable or place it in LPM during microsleep. For proper operation of the frequency divider 345, the reset signal rst_div should be provided to the frequency divider 345 in synchronous with the PLL clock signal PLL_CLK. Accordingly, the receiver front end 300 includes a synchronizer 340 (e.g., one or more cascaded flip-flops (FFs), such as a two-FF synchronizer) including a signal input configured to receive the frequency divider reset signal rst_div, a clock input configured to receive the PLL clock signal PLL_CLK, and an output configured to generate a frequency divider reset signal rst_div_psync synchronized to the clock domain of the PLL 330 (e.g., the PLL clock domain frequency divider reset signal rst_div_psync). The output of the synchronizer 340 is coupled to an enable/disable (reset) input of the frequency divider 345.

Thus, if the Rx digital front end 320 determines that there is no PDSCH data for the user equipment 120 based on the decoded PDCCH control data, the Rx digital front end 320 informs the microsleep controller 325 to assert the reset signals rst_pll and rst_div (e.g., as a logic high or one (1)) to disable or place in LPM the PLL 330 and frequency divider 345 during the microsleep symbol intervals S3 to S13 of the current subframe, respectively. The synchronizer 340 generates an asserted PLL clock domain reset signal rst_div_psync based on a clocking edge (e.g., rising edge) of the clock signal PLL_CLK. In response to the asserted reset signals rst_pll and rst_div_psync, the PLL 330 and frequency divider 345 goes into LPM. At the subframe boundary, the microsleep controller 325 deasserts the reset signals rst_pll and rst_div (e.g., as a logic low or zero (0)) to wake up the PLL 330 and frequency divider 345. The synchronizer 340 generates the deasserted PLL clock domain reset signal rst_div_psync based on a clocking edge (e.g., rising edge) of the clock signal PLL_CLK. In response to the deasserted reset signals rst_pll and rst_div_psync, the PLL 330 and frequency divider 345 become operational again.

An issue with the receiver front end 300 is that the phase $\Delta_1$ of the ADC clock signal ADC_CLK with respect to the subframe boundary may not be constant from subframe to subframe due to voltage/temperature drifts of the PLL clock signal PLL_CLK. If the phase $\Delta_1$ of the clock signal ADC_CLK with respect to the subframe boundary is not constant, a successful reception and decoding of the PDCCH data may not be achievable. In response to a failure of receiving and decoding the PDCCH data, high level software in the user equipment 120 may disable the microsleep controller 325; thereby, forcing the continuous operation of the PLL 330 and the frequency divider 345. Thus, any power saving achievable during microsleep may not be available, which may impact the continuous use battery life of the user equipment 120.

Figure 4A:
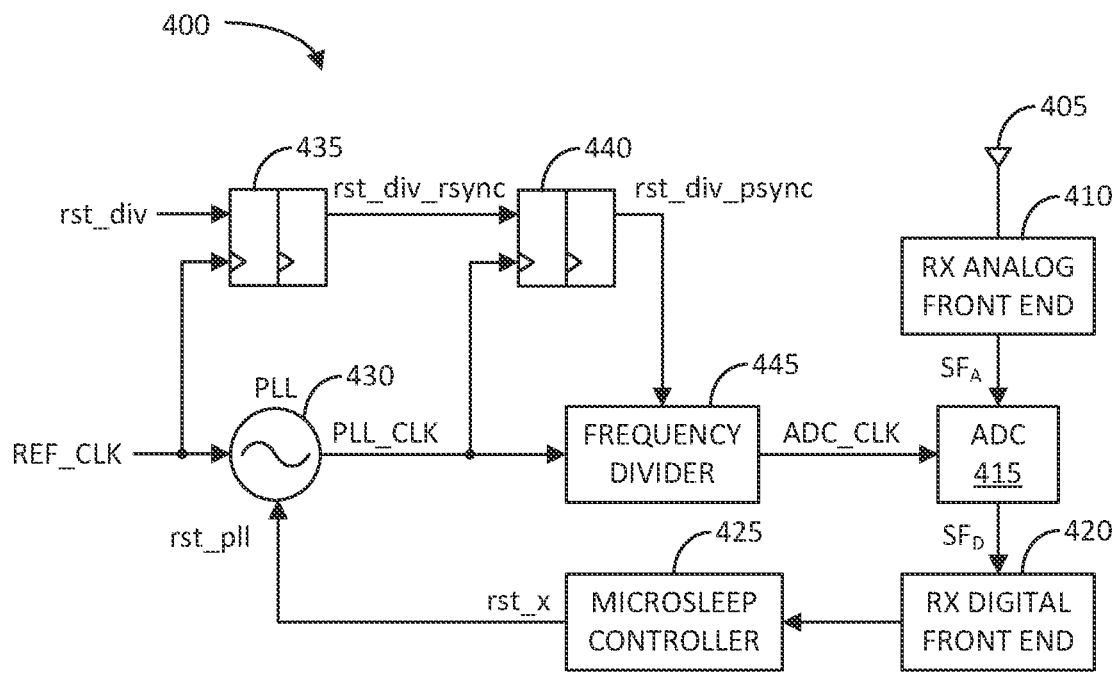
FIG. 4A illustrates a block diagram of another example receiver front end of a user equipment (UE) in accordance with another aspect of the disclosure.

FIG. 4A illustrates a block diagram of another example receiver front end 400 of a user equipment (UE) in accordance with another aspect of the disclosure. For example, the receiver front end 400 may be implemented in user equipment 120. In this regard, the receiver front end 400 may be configured to receive, digitize, and process the DL signal 200. The receiver front end 400 may be a variation of receiver front end 300, and includes many similar/same elements as indicated with the same reference numbers but with the most significant digit being a "4" in receiver front end 400 instead of a "3" as in receiver front end 300.

In receiver front end 400, the reference clock signal REF_CLK is generated during microsleep mode. In such a case, when the PLL 430 is woken up by the deasserted reset signal rst_pll, there will be a substantially constant phase relationship between the PLL clock signal PLL_CLK and the reference clock signal REF_CLK. So that the frequency divider 445 is also woken up based on the constant phase relationship between the reference clock signal REF_CLK and the PLL clock signal PLL_CLK, the receiver front end 400 includes two synchronizers 435 and 440.

The first synchronizer 435 (e.g., one or more cascaded FF, such as a two-FF synchronizer) synchronizes the frequency divider reset signal rst_div generated by the microsleep controller 425 to the clock domain of the reference clock signal REF_CLK. In this regard, the first synchronizer 435 includes a data input configured to receive the frequency divider reset signal rst_div and a clock input configured to receive the reference clock signal REF_CLK, and an output configured to generate the reference clock domain frequency divider reset signal rst_div_rsync. The second synchronizer 440 synchronizes the reference clock domain frequency divider reset signal rst_div_rsync to the clock domain of the PLL clock signal PLL_CLK. In this regard, the second synchronizer 440 includes a data input configured to receive the reference clock domain reset signal rst_div_rsync, a clock input configured to receive the PLL clock signal PLL_CLK, and an output configured to generate the PLL clock domain frequency divider reset signal rst_div_psync. The output of the second synchronizer 440 is coupled to the enable/disable (reset) input of the frequency divider 445 to provide the PLL clock domain reset signal rst_div_psync thereto. As the PLL clock domain reset signal rst_div_psync is synchronized to both the reference and PLL clock domains via synchronizers 435 and 440, the phase $\Delta_1$ of the ADC_CLK with respect to the subframe boundary is kept substantially constant from subframe-to-subframe, regardless of whether the PLL 430 and frequency divider 445 were in microsleep mode or continuously in operation mode.

Although there is a constant phase relationship between the PLL clock signal PLL_CLK and the reference clock signal REF_CLK, and by extension, the reference clock domain reset signal rst_div_rsync, the constant phase may not be deterministic. As such, the clocking (e.g., rising) edge of the PLL clock signal PLL_CLK may be close to the falling edge of the deasserted reference clock domain reset signal rst_div_rsync such that the first flip-flop of the second synchronizer 440 may become metastable. In other words, the relevant edges of the reset signal rst_div_rsync and clock signal PLL_CLK violate either the setup time or hold time of the second synchronizer 440 such that it becomes metastable. Thus, there may be a one PLL clock cycle ambiguity where the state or deassertion of the resulting PLL clock domain signal rst_div_psync is unknown. This is better explained with reference to the timing diagram of FIG. 4B.

Figure 4B:
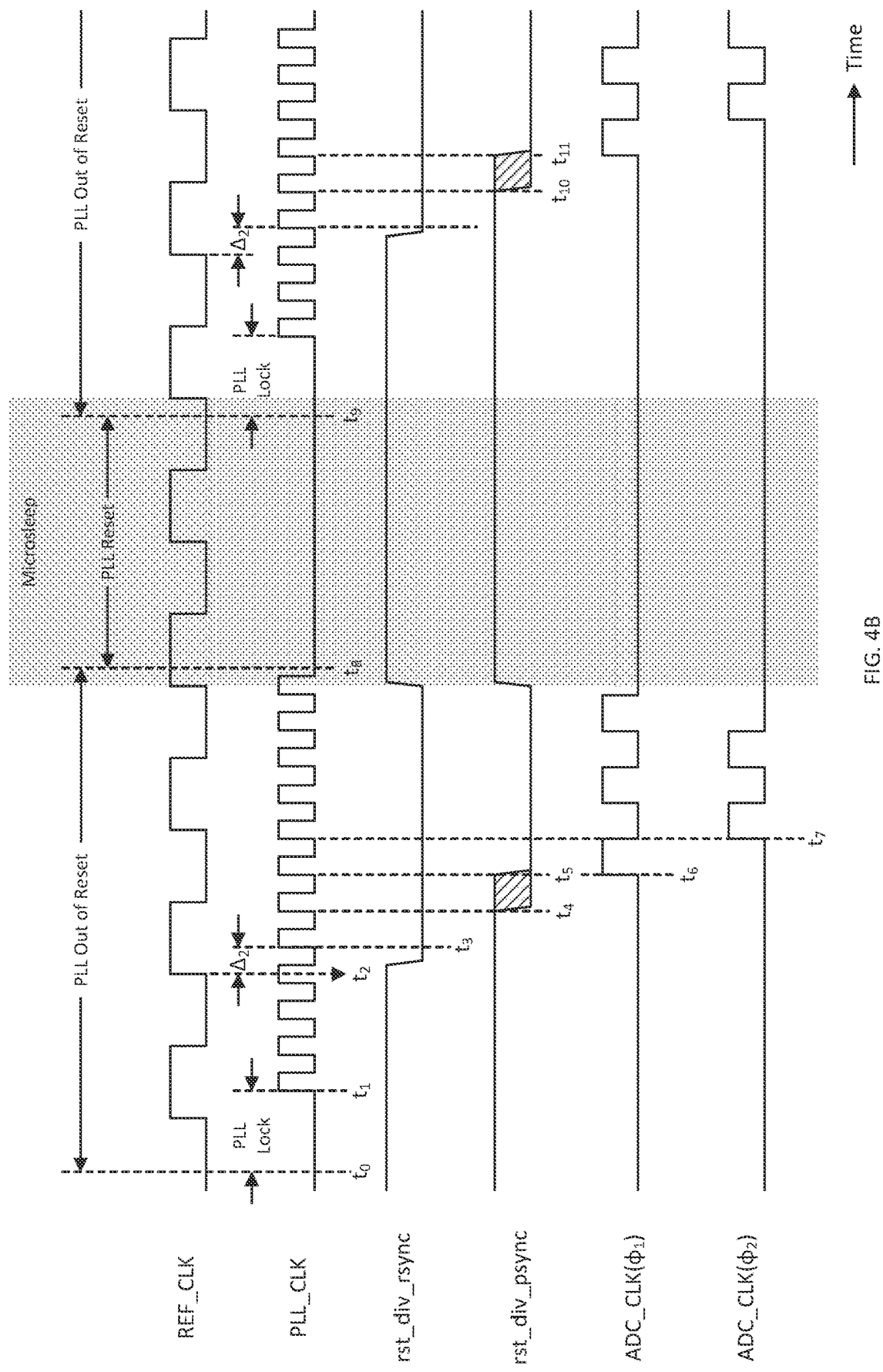
FIG. 4B illustrates a timing diagram of example signals associated with the receiver front end of FIG. 4A in accordance with another aspect of the disclosure.

FIG. 4B illustrates a timing diagram of example signals associated with the receiver front end 400 in accordance with another aspect of the disclosure. The horizontal axis of the timing diagram represents time. The vertical axis represents the states, from top to bottom, of the reference clock signal REF_CLK, the PLL clock signal PLL_CLK, the reference clock domain frequency divider reset signal rst_div_rsync, the PLL clock domain frequency divider reset signal rst_div_psync, the ADC clock signal ADC_CLK($\phi_1$) if it comes up with a first phase $\phi_1$, and the ADC clock signal ADC_CLK($\phi_2$) if it comes up with a second phase $\phi_2$.

With reference to both FIGS. 4A-4B, at time to the microsleep controller 425 deasserts the PLL reset signal rst_pll to wake up the PLL 430. In response to waking up, the PLL 430 phase locks the PLL clock signal PLL_CLK with the reference clock signal REF_CLK at time $t_1$. Accordingly, there is a substantially constant phase $\Delta_2$ between the clocking (e.g., rising) edge of the reference clock signal REF_CLK and the clocking (e.g., rising) edge of the PLL clock signal PLL_CLK as indicated by time interval $t_2$ to $t_3$.

Also, at time to, the microsleep controller 425 deasserts the frequency divider reset signal rst_div to wake up the frequency divider 445. At substantially coincidental with the rising edge of the reference clock signal REF_CLK, the first synchronizer 435 deasserts the reference clock domain reset signal rst_div_rsync. However, the constant phase difference $\Delta_2$ between the reference clock signal REF_CLK and the PLL clock signal PLL_CLK may be sufficiently small that deassertion of the reference clock domain reset signal rst_div_rsync violates the setup time for the second synchronizer 440. As a consequence, the first flip-flop of the second synchronizer 440 becomes metastable. Thus, the state or deassertion of the PLL clock domain reset signal rst_div_psync is ambiguous, where it may become deasserted at time $t_4$ or time $t_5$ as indicated by the corresponding hashed time interval.

If the PLL clock domain reset signal rst_div_psync becomes deasserted at time $t_4$, the frequency divider 445 generates the ADC clock signal ADC_CLK with the first phase $\phi_1$ where the first rising edge occurs at time $t_6$. However, if the PLL clock domain reset signal rst_div_psync becomes deasserted at time $t_5$, the frequency divider 445 generates the ADC clock signal ADC_CLK with the second phase $\phi_2$ where the first rising edge occurs at time $t_7$. The first and second phases $\phi_1$ and $\phi_2$ are opposite or substantially 180 degrees apart. Thus, this phase ambiguity in the ADC clock signal ADC_CLK may make the microsleep mode unavailable as the ADC clock signal ADC_CLK does not achieve the constant phase $\Delta_1$ with respect to subframe boundaries for proper sampling and digitizing by the ADC 415. Moreover, after the next microsleep interval between times $t_8$ and $t_9$, the deassertion of the PLL clock domain reset signal rst_div_psync is again ambiguous as indicated by the hashed time interval between times $t_{10}$ and $t_{11}$. During this next subframe, the frequency divider 445 may generate the ADC clock signal ADC_CLK with the first or second phase $\phi_1$ or $\phi_2$, which may be different than the phase $\phi_2$ or $\phi_1$ of the ADC clock signal ADC_CLK of the previous subframe.

Figure 5:
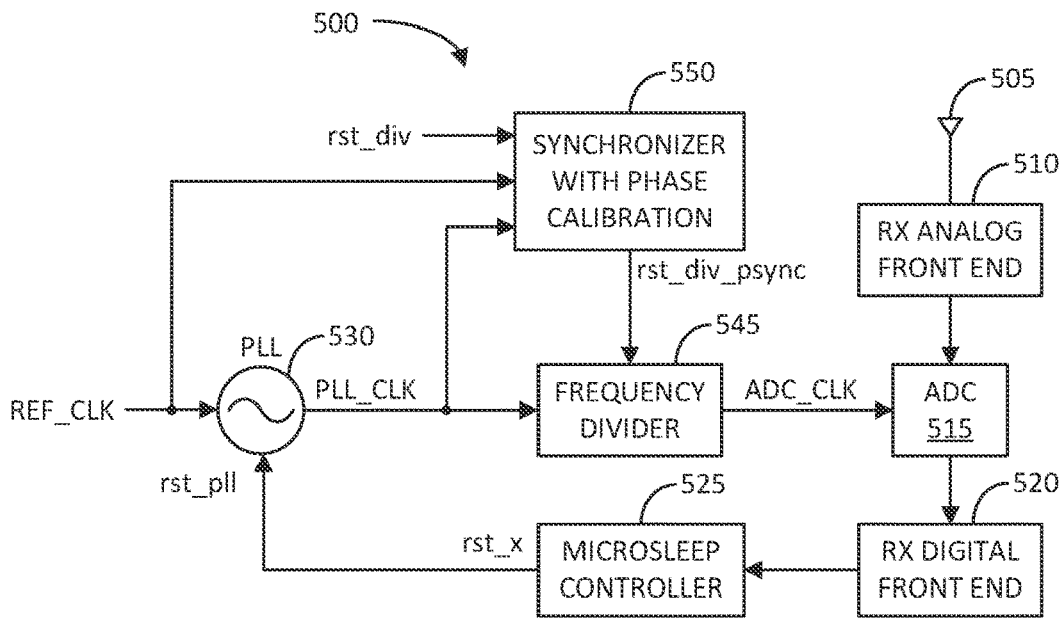
FIG. 5 illustrates a block diagram of another example receiver front end of a user equipment (UE) in accordance with another aspect of the disclosure.

FIG. 5 illustrates a block diagram of another example receiver front end 500 of a user equipment (UE) in accordance with another aspect of the disclosure. For example, the receiver front end 500 may be implemented in user equipment 120. In this regard, the receiver front end 500 may be configured to receive, digitize, and process the DL signal 200. The receiver front end 500 may be a variation of receiver front end 300 or 400, and includes many similar/same elements as indicated with the same reference numbers but with the most significant digit being a "5" in receiver front end 500 instead of a "3" or "4" as in receiver front end 300 or 400, respectively.

In contrast to receiver front ends 300 and 400, the receiver front end 500 includes a synchronizer with phase calibration 550 configured to generate a PLL clock domain frequency divider reset signal rst_div_psync that initiates the ADC clock signal ADC_CLK after microsleep intervals with a substantially constant phase $\Delta_1$ with respect to subframe boundaries of the received DL signal 200.

As discussed in more detail further herein, the synchronizer with phase calibration 550 includes a first synchronizer configured to synchronize the frequency divider reset signal rst_div, generated by the microsleep controller 525, with the reference clock signal REF_CLK to generate a reference clock domain frequency divider reset signal rst_div_rsync. The synchronizer with phase calibration 550 is further configured to detect a phase difference between the reference clock domain reset signal rst_div_rsync and the PLL clock signal PLL_CLK, and adjust the phase of the reference clock domain reset signal rst_div_rsync to eliminate or reduce the likelihood of metastable occurring in a second synchronizer. The second synchronizer is configured to synchronize the phase-adjusted or corrected reference clock domain reset signal rst_div_rsync with the PLL clock signal PLL_CLK to generate the PLL clock domain frequency divider reset signal rst_div_psync.

Figure 6:
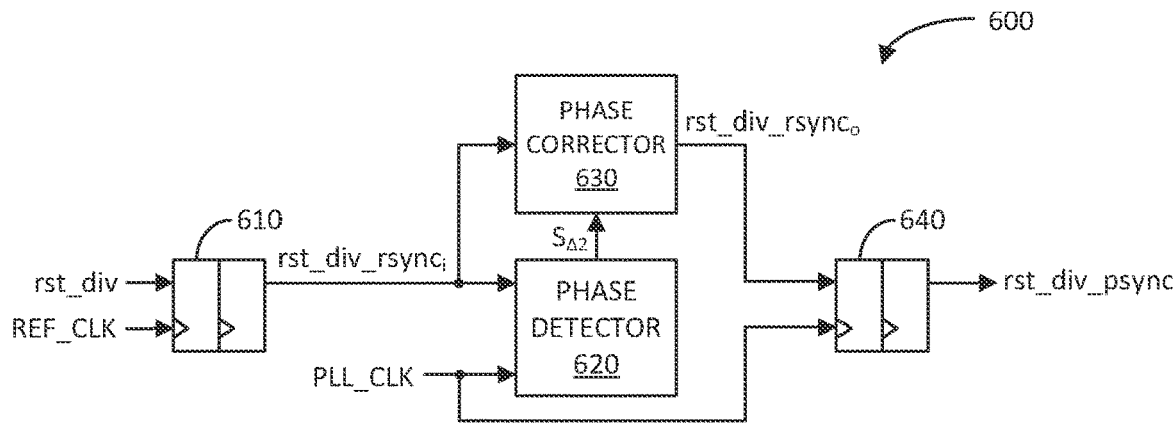
FIG. 6 illustrates a block diagram of an example synchronizer with phase calibration in accordance with another aspect of the disclosure.

FIG. 6 illustrates a block diagram of an example synchronizer with phase calibration 600 in accordance with another aspect of the disclosure. The synchronizer with phase calibration 600 may be an example high-level implementation of the synchronizer with phase calibration 550 previously discussed.

The synchronizer with phase calibration 600 includes a first synchronizer 610, a phase detector 620, a phase corrector (adjuster) 630, and a second synchronizer 640. The first synchronizer 610 (e.g., a multi- or two-flip-flop synchronizer) includes a data input configured to receive the frequency divider reset signal rst_div (e.g., from the microsleep controller 525), a clock input configured to receive the reference clock signal REF_CLK, and an output configured to produce an input reference clock domain frequency divider reset signal rst_div_rsync$_i$. The phase detector 620 includes a first input configured to receive the input reference clock domain frequency divider reset signal rst_div_rsync$_i$ and a second input configured to receive the PLL clock signal PLL_CLK. The phase detector 620 is configured to generate a signal $S_{A2}$ indicative of a phase difference between a deassertion (e.g., falling) edge of the input reference clock domain frequency divider reset signal rst_div_rsync$_i$ and a clocking (e.g., rising) edge of the PLL clock signal PLL_CLK, as exemplified in the timing diagram of FIG. 4B.

The phase corrector (adjuster) 630 includes a first input configured to receive the input reference clock domain frequency divider reset signal rst_div_rsync$_i$, and a second input configured to receive the phase difference signal $S_{A2}$. The phase corrector 630 is configured to adjust the phase difference $S_{A2}$ between the deassertion edge of the input reference clock domain frequency divider reset signal rst_div_rsync$_i$ and the clocking edge of the PLL clock signal PLL_CLK to generate an output reference clock domain frequency divider reset signal rst_div_rsync$_o$ that prevents or reduces the likelihood of the second synchronizer 640 becoming metastable. It shall be understood that the phase corrector 630 may not adjust the phase of the input reset signal rst_div_rsync$_i$ and pass it through as the output reset signal rst_div_rsync$_o$ if the phase difference signal $S_{A2}$ indicates that the input reset signal rst_div_rsync$_i$ is not likely to cause the second synchronizer 640 to go metastable.

More specifically, the phase corrector 630 is configured to adjust the phase difference $S_{A2}$ between the deassertion edge of the input reference clock domain frequency divider reset signal rst_div_rsync$_i$ and the clocking edge of the PLL clock signal PLL_CLK such that the output reference clock domain frequency divider reset signal rst_div_rsync$_o$ meets the setup and hold time margin requirements of the second synchronizer 640. For example, the phase corrector 630 may be configured to delay the input reference clock domain frequency divider reset signal rst_div_rsync$_i$ such that the deassertion edge of the output reference clock frequency divider reset signal rst_div_rsync$_o$ occurs at substantially the non-clocking (e.g., falling) edge of the PLL clock signal PLL_CLK. The second synchronizer 640 includes a first input configured to receive the output reference clock domain frequency divider reset signal rst_div_rsync$_o$, a second input configured to receive the PLL clock signal PLL_CLK, and an output configured to generate the PLL clock domain frequency divider reset signal rst_div_psync.

Figure 7:
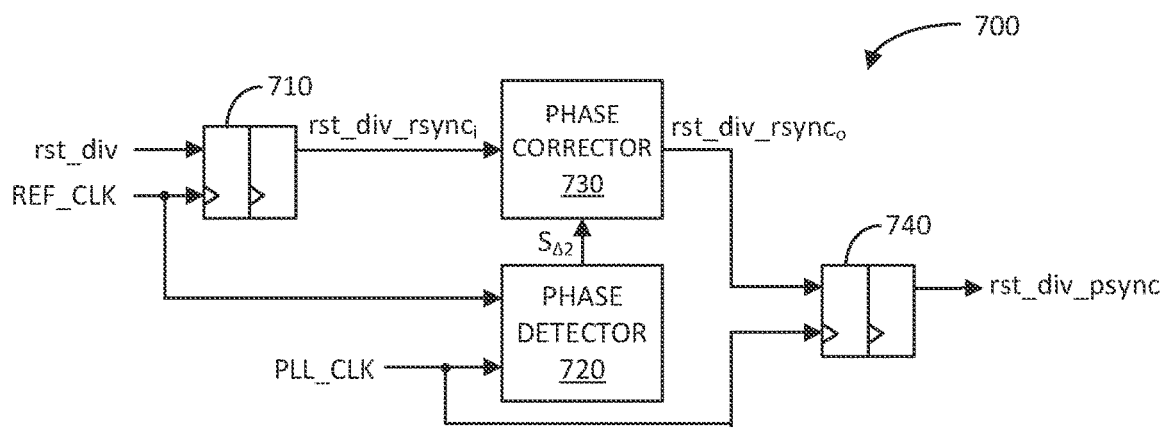
FIG. 7 illustrates a block diagram of another example synchronizer with phase calibration in accordance with another aspect of the disclosure.

FIG. 7 illustrates a block diagram of another example synchronizer with phase calibration 700 in accordance with another aspect of the disclosure. The synchronizer with phase calibration 700 may be an example high-level implementation of the synchronizer with phase calibration 550 previously discussed. The synchronizer with phase calibration 700 may be a variation of the synchronizer with phase calibration 600 previously discussed, including many of the same/similar elements identified by the same reference numbers with the exception that the most significant digit is a "7" in synchronizer with phase calibration 700 instead of a "6" as in synchronizer with phase calibration 600.

More specifically, as the clocking (e.g., rising) edge of the reference clock signal REF_CLK initiates the deassertion edge of the input reference clock domain frequency divider reset signal rst_div_rsync$_i$, the phase detector 720 may alternatively generate the phase difference signal $S_{A2}$ substantially indicative of a phase difference between a deassertion (e.g., falling) edge of the input reference clock domain frequency divider reset signal rst_div_rsync$_i$ and a clocking (e.g., rising) edge of the PLL clock signal PLL_CLK, as exemplified in the timing diagram of FIG. 4B. Otherwise, the first synchronizer 710, phase corrector 730, and second synchronizer 740 operate in the same/similar manner as the first synchronizer 610, phase corrector 630, and second s synchronizer 640 of the synchronizer with phase calibration 600 previously discussed.

Figure 8A:
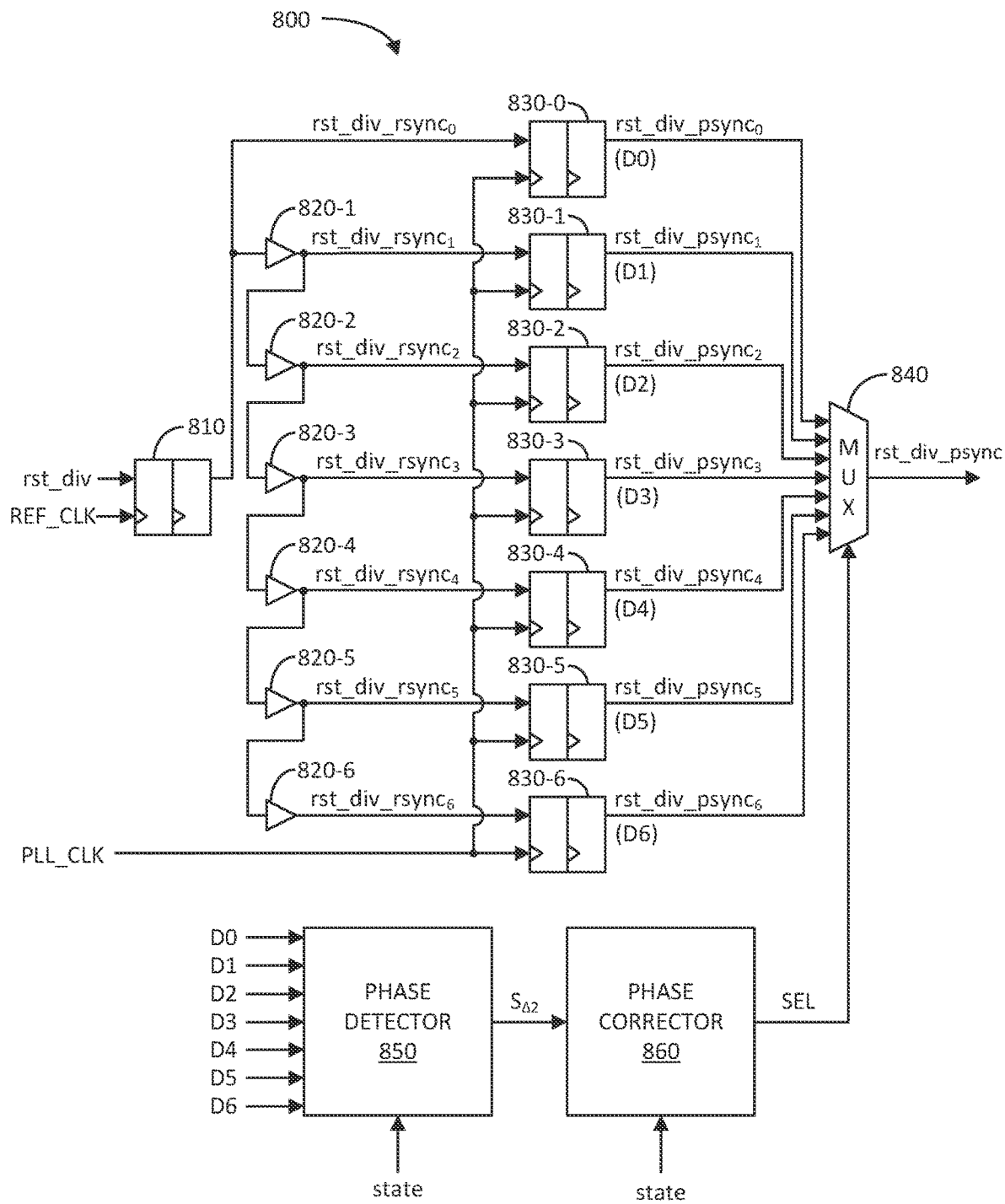
FIG. 8A illustrates a block diagram of another example synchronizer with phase calibration in accordance with another aspect of the disclosure.

FIG. 8A illustrates a block diagram of another example synchronizer with phase calibration 800 in accordance with another aspect of the disclosure. The synchronizer with phase calibration 800 may be an example detailed implementation of the synchronizer with phase calibration 550 previously discussed.

The synchronizer with phase calibration 800 includes a first synchronizer 810, a set of N-1 cascaded delay buffers 820-1 to 820-6, a set of N second synchronizers 830-0 to 830-6, a multiplexer 840, a phase detector 850, and a phase corrector (adjuster) 860, where N is seven (7) in this example, but could be another integer. The first synchronizer 810 is configured to synchronize a frequency divider reset signal rst_div (e.g., generated by the microsleep controller 525) with the reference clock signal REF_CLK to generate a first reference clock domain frequency divider reset signal rst_div_rsync$_0$. In this regard, the first synchronizer 810 includes a data input configured to receive the reset signal rst_div, a clock input configured to receive the reference clock signal REF_CLK, and an output configured to generate the first reference clock domain frequency divider reset signal rst_div_rsync$_0$.

The set of delay buffers 820-1 to 820-6 are configured to generate a set of N-1 reference clock domain frequency divider reset signals rst_div_rsync$_1$ to rst_div_rsync$_6$ by successively delaying the first reference clock domain reset signal rst_div_rsync$_0$, respectively. In this regard, the set of delay buffers 820-1 to 820-6 include inputs coupled to the outputs of the first synchronizer 810 and the set of delay buffers 820-1 to 820-5, respectively. The signal delay effectuated by the set of delay buffers 820-1 to 820-6 may be substantially the same (e.g., 1/N the period of the PLL clock signal PLL_CLK).

The set of N second synchronizers 830-0 to 830-6 are configured to synchronize the set of N reference clock domain reset signals rst_div_rsync$_0$ to rst_div_rsync$_6$ with the PLL clock signal PLL_CLK to generate a set of N PLL clock domain frequency divider reset signals rst_div_psync$_0$ to rst_div_psync$_6$, respectively. In this regard, the set of second synchronizers 830-0 to 830-6 includes a set of data inputs coupled to the outputs of the first synchronizer 810 and the set of delay buffers 820-1 to 820-6, respectively; a set of clock inputs configured to receive the PLL clock signal PLL_CLK; and a set of outputs configured to generate the set of N PLL clock domain reset signals rst_div_psync$_0$ to rst_div_psync$_6$, respectively. The state of the PLL clock domain reset signals rst_div_psync$_0$ to rst_div_psync$_6$ in response to a clocking edge of the PLL clock signal PLL_CLK may be referred to as delay vector D0-D6, respectively.

As discussed in more detail herein, the phase detector 850 is configured to generate the phase difference signal $S_{A2}$ based on a set of one or more delay vectors D0-D6. In this regard, the phase detector 850 includes a set of inputs coupled to the outputs of the set of second synchronizers 830-0 to 830-6, respectively. The phase corrector 860 is configured to generate a select (SEL) signal for the multiplexer 840 based on the phase difference signal $S_{A2}$ generated by the phase detector 850. In this regard, the phase corrector 860 includes an input coupled to the output of the phase detector 850. The select (SEL) signal controls the multiplexer 840 to output one of the set of PLL clock domain reset signals rst_div_psync$_0$ to rst_div_psync$_6$ not prone to metastable by the corresponding second synchronizer. In this regard, the multiplexer 840 includes a set of inputs coupled to the outputs of the set of second synchronizers 830-0 to 830-6, respectively; a select input coupled to the output of the phase corrector 860, and an output configured to generate the PLL clock domain frequency reset signal rst_div_psync for the frequency divider 545.

Figure 8B:
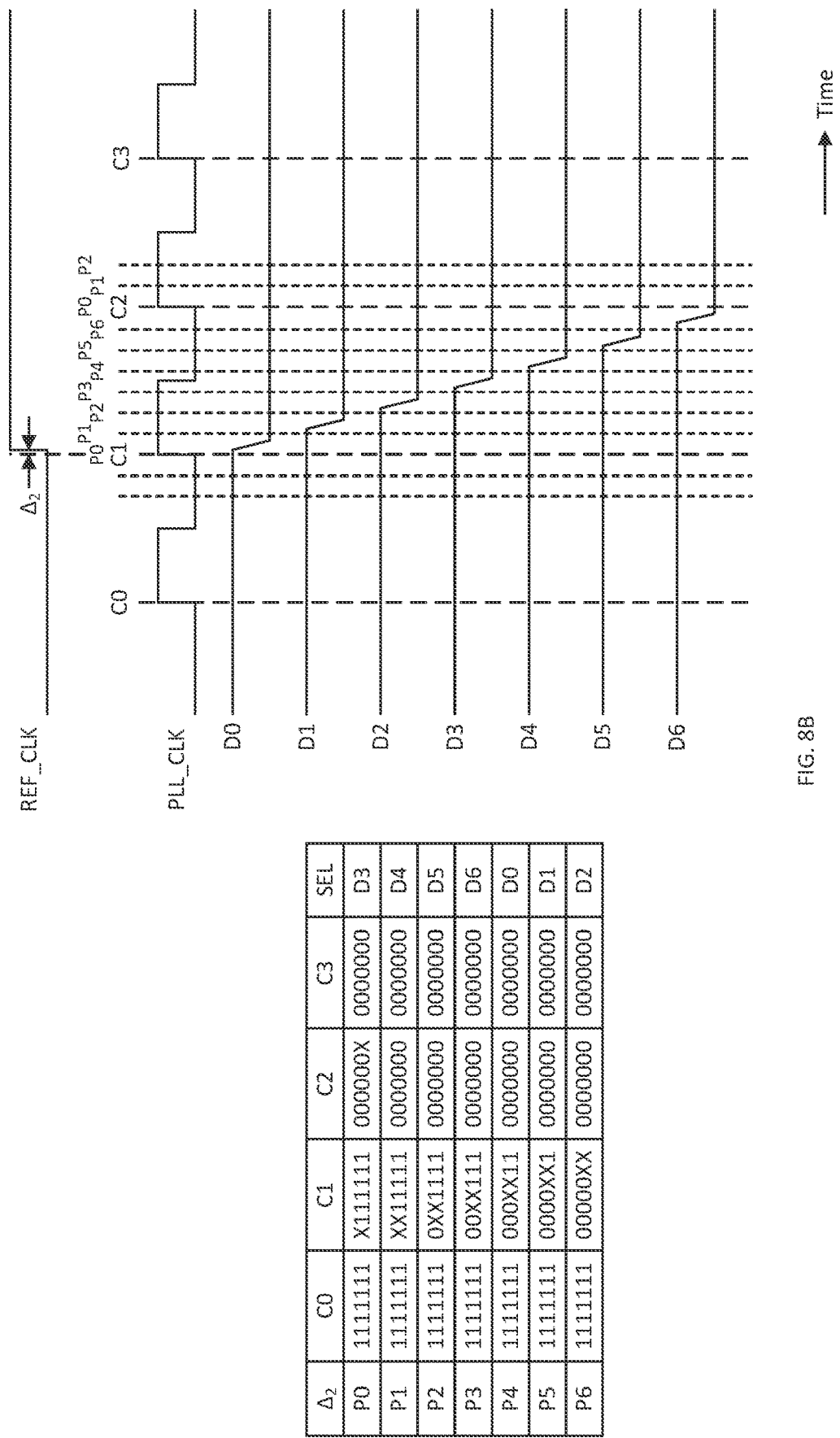
FIG. 8B illustrates a timing diagram and table related to an example set of signals associated with the synchronizer with phase calibration of FIG. 8A in accordance with another aspect of the disclosure.

FIG. 8B illustrates a timing diagram and table related to an example set of signals associated with the synchronizer with phase calibration 800 in accordance with another aspect of the disclosure. The horizontal axis of the timing diagram represents time. The vertical axis of the timing diagram, from top to bottom, represents the states of the reference clock signal REF_CLK, the PLL clock signal PLL_CLK, and the set of reference clock domain reset signals rst_div_rsync$_0$ to rst_div_rsync$_6$ that produce the delay vector D0-D6 produced at the outputs of the set of second synchronizers 830-0 to 830-6 in response to the clocking edge of the PLL clock signal PLL_CLK, respectively.

The table includes six (6) columns, from left to right, representing the phase difference $\Delta_2$, the values of the delay vector D0-D6 for four (4) consecutive periods C0-C3 of the PLL clock signal PLL_CLK, and the corresponding selection of one of the set of PLL clock domain reset signals associated with delay vector D0-D6 indicated by the select (SEL) signal, respectively. The table includes seven (7) rows indicating a set of N possible phase difference designators P0 to P6 for the detected phase difference $\Delta_2$, respectively.

In this example, the phase difference $\Delta_2$ between the clocking edges of the reference clock signal REF_CLK and the PLL clock signal PLL_CLK, corresponding to phase difference designator P0, is relatively small as the clocking (e.g., rising) edge of the reference clock signal REF_CLK occurs close in time with the clocking (e.g., rising) edge of the PLL clock signal PLL_CLK.

Thus, with reference to both FIGS. 8A-8B, when the rising edge of the PLL clock signal PLL_CLK occurs at the start of the first period C0, the set of reference clock domain reset signals rst_div_rsync$_0$ to rst_div_rsync$_6$ are all logic ones (1s). Thus, the set of second synchronizers 830-0 to 830-6 generate the delay vector D0-D6 as 1111111, as indicated in the table. When the rising edge of the PLL clock signal PLL_CLK occurs at the start of the second period C2, the first reference clock domain reset signals rst_div_rsync$_0$ violates a timing margin requirement (e.g., the hold time), and consequently, the data D0 is indeterministic X, whereas the remaining reference clock domain reset signals rst_div_rsync$_1$ to rst_div_rsync$_6$ are all logic ones (1s). Thus, the set of second synchronizers 830-0 to 830-6 generate the delay vector D0-D6 as X111111, as indicated in the table.

When the rising edge of the PLL clock signal PLL_CLK occurs at the start of the third period C2, the set of reference clock domain reset signals rst_div_rsync$_0$ to rst_div_rsync$_5$ are all logic zeros (0s), and the last reference clock domain reset signal rst_div_rsync$_6$ violates a timing margin requirement (e.g., the setup time), and consequently, the data D6 is indeterministic X. Thus, the set of second synchronizers 830-0 to 830-6 generate the delay vector D0-D6 as 000000X, as indicated in the table. When the rising edge of the PLL clock signal PLL_CLK occurs at the start of the fourth period C3, the set of reference clock domain reset signals rst_div_rsync$_0$ to rst_div_rsync$_6$ are all logic zeros (0s). Thus, the set of second synchronizers 830-0 to 830-6 generate the delay vector D0-D6 as 0000000, as indicated in the table.

Based on the set of delay vectors D0-D6 1111111, X111111, 000000X, and 0000000 for clock periods C0 to C3, the phase detector 850 generates the phase difference signal $S_{A2}$ with a phase difference designator P0, as indicated in the table. In response to the phase difference signal $S_{A2}$ indicating phase difference designator P0, the phase corrector 860 generates the select (SEL) signal to cause the multiplexer 840 to output the PLL clock domain frequency divider reset signal rst_div_psync$_3$ (D3), as indicated in the table. With reference to the timing diagram, the selected PLL clock domain reset signal rst_div_psync$_3$ corresponds to the reference clock domain reset signal rst_div_rsync$_3$ whose deassertion edge is closest to the non-clocking (e.g., falling) edge of the PLL_CLK. At such location, the deassertion edge is farthest away from the clocking edges of the PLL clock signal PLL_CLK. Accordingly, this ensures that the reference clock domain reset signal rst_div_psync$_3$ does not violate any timing margin requirements; and thus, the corresponding second synchronizer 830-3 is not likely to become metastable.

Figure 8C:
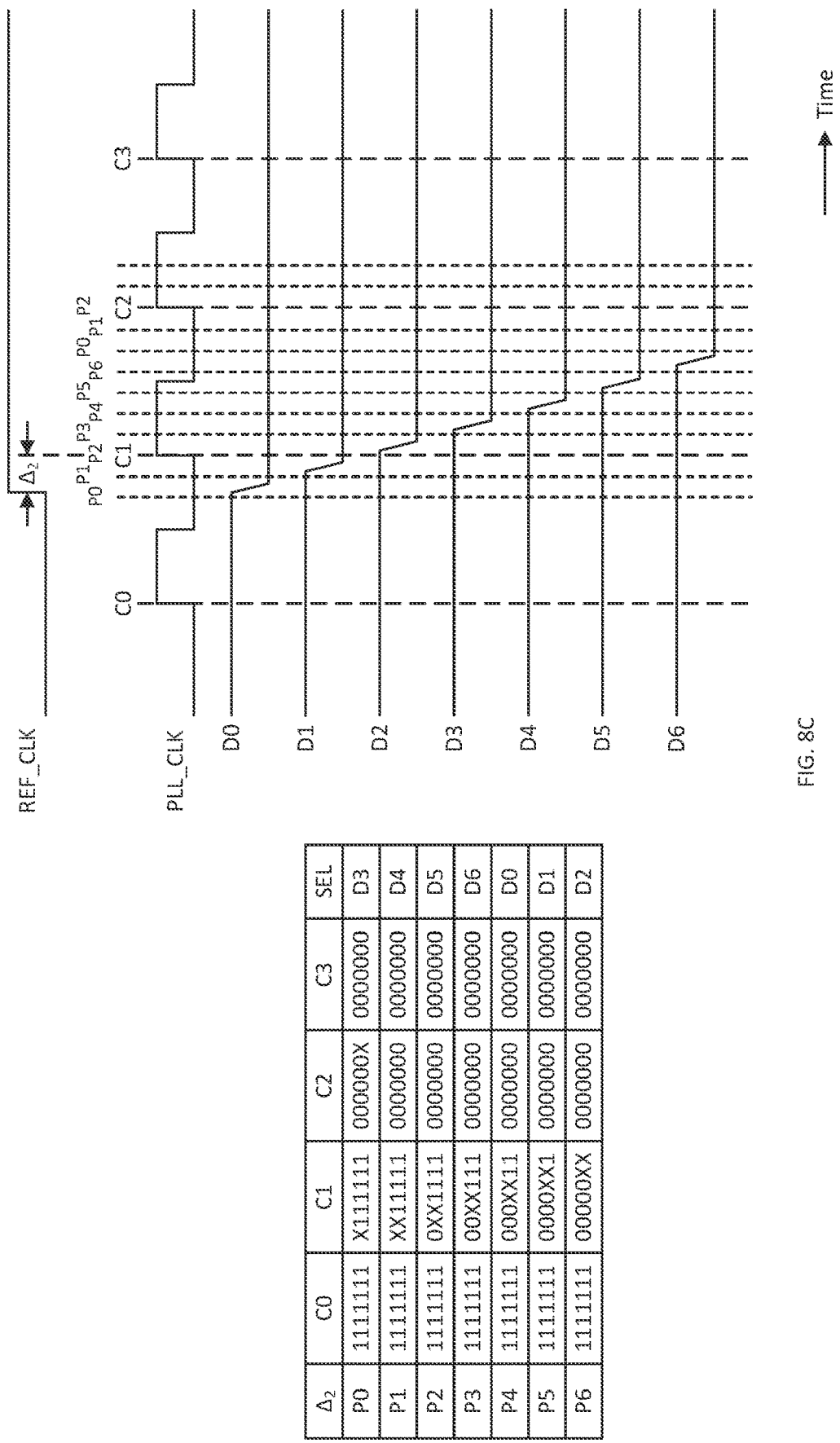
FIG. 8C illustrates a timing diagram and table related to another example set of signals associated with the synchronizer with phase calibration of FIG. 8A in accordance with another aspect of the disclosure.

FIG. 8C illustrates a timing diagram and table related to another example set of signals associated with the synchronizer with phase calibration 800 in accordance with another aspect of the disclosure. In this example, the phase difference $\Delta_2$ between the clocking (e.g., rising) edges of the reference and PLL clock signals REF_CLK and PLL_CLK, corresponding to phase difference designator P2, is greater than the phase difference $\Delta_2$, corresponding to phase difference designator P0, of the example of FIG. 8B.

With reference to both FIGS. 8A and 8C, when the rising edge of the PLL clock signal PLL_CLK occurs at the start of the first period C0, the set of reference clock domain reset signals rst_div_rsync$_0$ to rst_div_rsync$_6$ are all logic ones (1s). Thus, the set of second synchronizers 830-0 to 830-6 generate the delay vector D0-D6 as 1111111, as indicated in the table. When the rising edge of the PLL clock signal PLL_CLK occurs at the start of the second period C2, the first reference clock domain reset signals rst_div_rsync$_0$ is at a logic zero (0); the second and third reference clock domain reset signals rst_div_rsync$_1$ and rst_div_rsync$_2$ violate timing margin requirements (e.g., the setup and hold times, respectively), and consequently, the data D1 and D2 are indeterministic X; and the remaining reference clock domain reset signals rst_div_rsync$_3$ to rst_div_rsync$_6$ are all logic ones (1s). Thus, the set of second synchronizers 830-0 to 830-6 generate the delay vector D0-D6 as 0XX1111, as indicated in the table.

When the rising edge of the PLL clock signal PLL_CLK occurs at the start of the third period C2, the set of reference clock domain reset signals rst_div_rsync$_0$ to rst_div_rsync$_6$ are all logic zeros (0s), and thus, the set of second synchronizers 830-0 to 830-6 generate the delay vector D0-D6 as 0000000, as indicated in the table. Similarly, when the rising edge of the PLL clock signal PLL_CLK occurs at the start of the fourth period C3, the set of reference clock domain reset signals rst_div_rsync$_0$ to rst_div_rsync$_6$ are all logic zeros (0s). Thus, the set of second synchronizers 830-0 to 830-6 generate the delay vector D0-D6 as 0000000, as indicated in the table.

Based on the set of delay vectors D0-D6 1111111, 0XX1111, 0000000, and 0000000 for clock periods C0 to C3, the phase detector 850 generates the phase difference signal $S_{A2}$ with a phase difference designator P2, as indicated in the table. In response to the phase difference signal $S_{A2}$ indicating phase difference designator P2, the phase corrector 860 generates the select (SEL) signal to cause the multiplexer 840 to output the PLL clock domain reset signal rst_div_psync$_5$ (D5), as indicated in the table. With reference to the timing diagram, the selected PLL clock domain reset signal rst_div_psync$_5$ corresponds to the reference clock domain reset signal rst_div_rsync$_5$ whose deassertion edge is closest to the non-clocking (e.g., falling) edge of the PLL_CLK. At such location, the deassertion edge is farthest away from the clocking edges of the PLL clock signal PLL_CLK. Accordingly, this ensures that the reference clock domain reset signal rst_div_psync$_5$ does not violate any timing margin requirements; and thus, the corresponding second synchronizer 830-5 is not likely to become metastable.

With reference to synchronizers with phase calibration 600 and 700, the first synchronizer 810 of synchronizer with phase calibration 800 corresponds to the first synchronizers 610 and 710. The set of delay buffers 820-1 to 820-6, the set of second synchronizers 830-0 to 830-6, and the phase detector 850 corresponds to the phase detectors 620 and 720. The phase corrector 860 corresponds to the phase correctors 630 and 730. And, the second synchronizer associated with the selected PLL clock domain reset signal rst_div_psync$_{sel}$ and the multiplexer 840 corresponds to the second synchronizers 640 and 740.

Figure 8D:
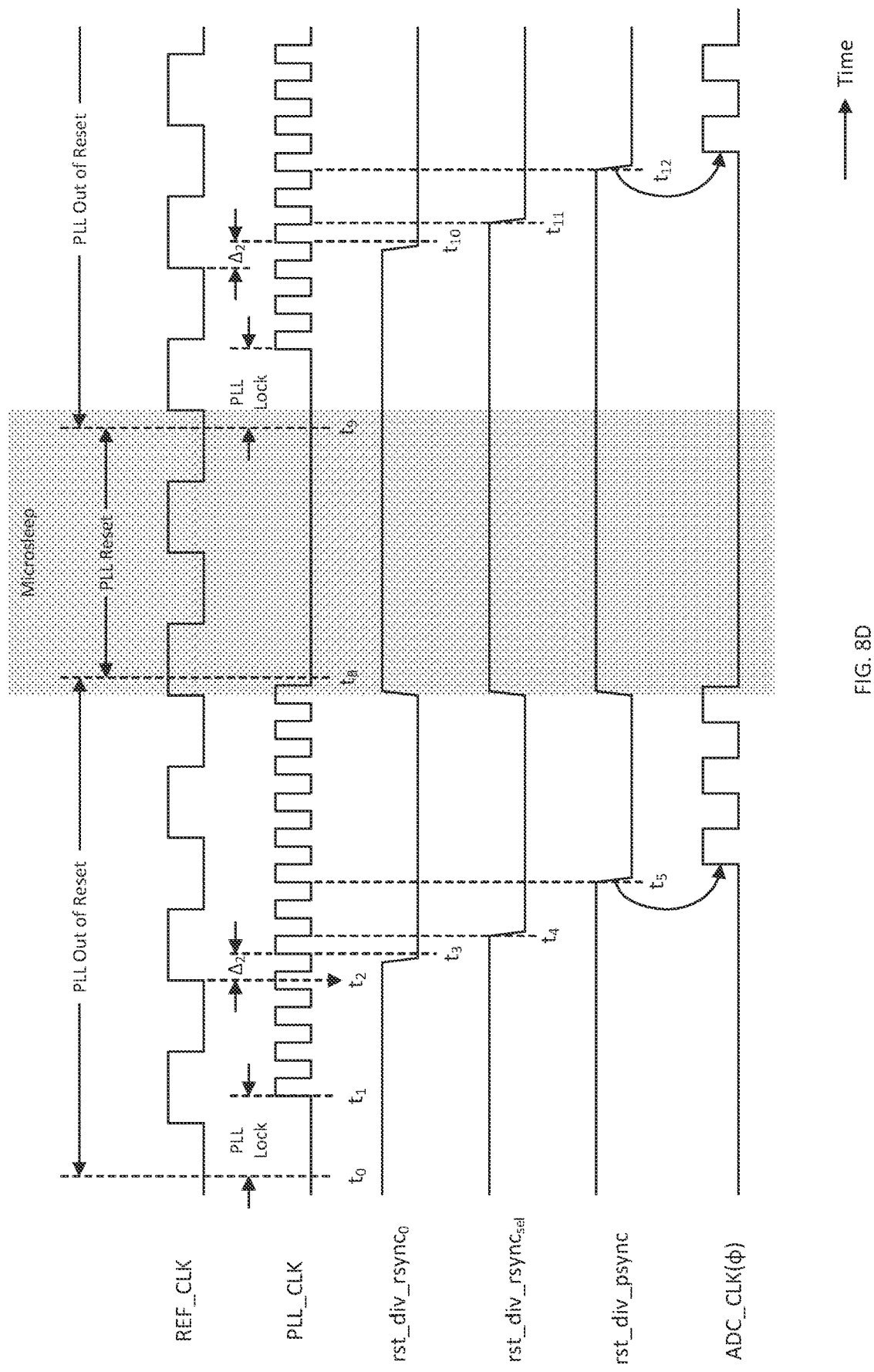
FIG. 8D illustrates a timing diagram of example signals associated with the receiver front end of FIG. 5 in accordance with another aspect of the disclosure.

FIG. 8D illustrates a timing diagram of example signals associated with the receiver front end 500 in accordance with another aspect of the disclosure. The timing diagram is similar to timing diagram of FIG. 4B, with the exception that that the selected reference clock domain reset signal is shown, and only one phase of the ADC clock signal ADC_CLK is shown as the receiver front end 500 solves the metastable issue associated with the second synchronizer 440 of receiver front end 400 as previously discussed in detail.

Accordingly, with reference to both FIGS. 5, 8A, and 8D, at time to the microsleep controller 525 deasserts the PLL reset signal rst_pll to wake up the PLL 530. In response to waking up, the PLL 530 phase locks the PLL clock signal PLL_CLK with the reference clock signal REF_CLK at time $t^1$. Accordingly, there is a substantially constant phase difference $\Delta_2$ between the clocking (e.g., rising) edge of the reference clock signal REF_CLK and the clocking (e.g., rising) edge of the PLL clock signal PLL_CLK as indicated by time interval $t_2$ to $t_3$.

Also, at time to, the microsleep controller 525 deasserts the frequency divider reset signal rst_div to subsequently wake up the frequency divider 545. At substantially coincidental with the rising edge of the reference clock signal REF_CLK at time $t_2$, the first synchronizer 810 deasserts the first reference clock domain reset signal rst_div_rsync$_0$. As discussed, the set of delay buffers 820-1 to 820-6 generate the remaining delay-staggered six (6) reference clock domain reset signals rst_div_rsync$_1$ to rst_div_rsync$_6$, respectively. Per the phase calibration procedure as discussed with reference to FIGS. 8B and 8C, one of the set of reference clock domain reset signals rst_div_rsync$_1$ to rst_div_rsync$_6$ has been selected rst_div_rsync$_{sel}$ because its deassertion edge lies closest in time with the non-clocking (e.g., falling) edge of the PLL clock signal PLL_CLK at time $t_4$. Thus, the second synchronizer (e.g., one of 830-0 to 830-6) associated with the selected reference clock domain reset signal rst_div_rsync$_{sel}$ does not become metastable.

The multiplexer 840 outputs the PLL clock domain reset signal rst_div_psync associated with the selected reference clock domain reset signal rst_div_rsync$_{sel}$. Accordingly, the deassertion edge of the PLL clock domain reset signal rst_div_psync at time $t_5$ occurs at substantially at the same phase with respect to the clocking edge of the reference clock signal REF_CLK. In response, the frequency divider 545 generates the ADC clock signal ADC_CLK with substantially the same phase $\Delta_1$ with respect to each subframe boundary of the received DL signal 200. Thus, the user equipment 120 may take advantage of microsleep in order to conserve power.

Figure 8E:
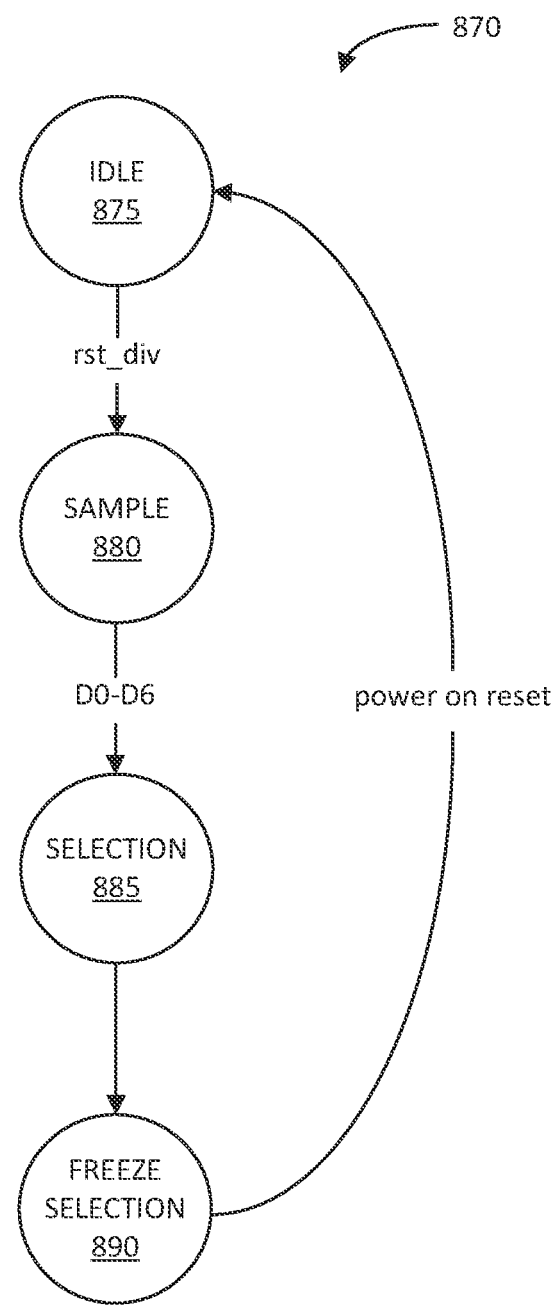
FIG. 8E illustrates a state diagram of an example finite state machine (FSM) for operating an example synchronizer with phase calibration in accordance with another aspect of the disclosure.

FIG. 8E illustrates a state diagram of an example finite state machine (FSM) 870 for operating the synchronizer with phase calibration 800 in accordance with another aspect of the disclosure. The receiver front end 500 may include the FSM 870, for example, in the microsleep controller 525 or in the synchronizer with phase calibration 550 for controlling the operation of any of the synchronizer with phase calibration 550, 600, 700, and 800 described herein. As explicitly illustrated with regard to synchronizer with phase calibration 800, the phase detector 850 and phase corrector 860 may include respective inputs to receive the current state of the FSM 870 to control their operations.

In particular, the FSM 870 may enter an idle state 875 in response to a power on reset (POR) of the user equipment 120. In the idle state 875, the synchronizer with phase calibration 800 may get prepared to perform another phase calibration to select the PLL clock domain frequency divider reset signals rst_div_psync$_0$ to rst_div_psync$_6$, which is less prone to metastable condition of the corresponding second synchronizer. After the idle state 875, the FSM 870 may enter a sample calibration state 880 to cause the synchronizer with phase calibration 800 to generate a set of delay vectors D0-D6 for a set of consecutive periods of the PLL clock signal PLL_CLK, as previously discussed.

Then the FSM 870 may enter a selection calibration state 885 where the synchronizer with phase calibration 800 makes a selection of one of the select the PLL clock domain frequency divider reset signals rst_div_psync$_0$ to rst_div_psync$_6$ based on the set of delay vectors D0-D6 obtained in the sample calibration state 880. Finally, the FSM 870 may enter a freeze selection operational state 890 where the selection of the PLL clock domain frequency divider reset signal rst_div_psync is frozen or fixed for operation of the frequency divider 545 as it goes into and out of microsleep mode. Upon a subsequent POR, the FSM 870 may once again enter the idle state 875 to repeat the phase calibration process as the selection of the PLL clock domain frequency divider reset signals rst_div_psync$_0$ to rst_div_psync$_6$ may be different than the prior selection for various reasons, such as temperature changes, voltage changes, and other changes in operation conditions.

Figure 9:
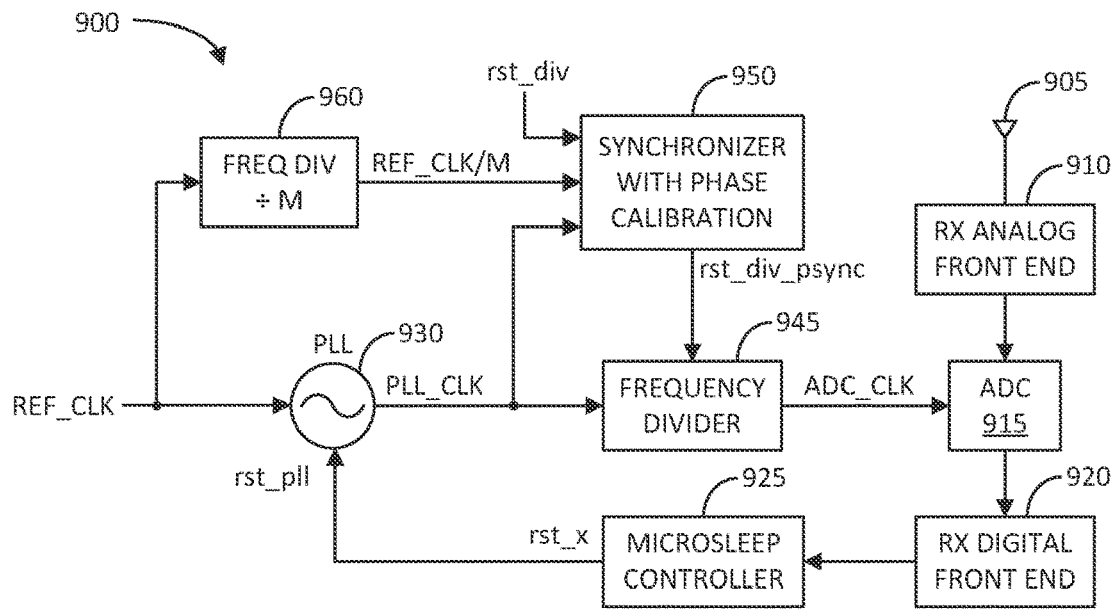
FIG. 9 illustrates a block diagram of another example receiver front end of a user equipment (UE) in accordance with another aspect of the disclosure.

FIG. 9 illustrates a block diagram of another example receiver front end 900 of a user equipment (UE) in accordance with another aspect of the disclosure. The receiver front end 900 is a variation of receiver front end 500 previously discussed, and includes many of the same/similar elements as indicated by the same reference numbers with the exception that their most significant digit is a "9" in receiver front end 900 instead of a "5" as in receiver front end 500.

In the description of receiver front end 500, the frequency divider 545 is an integer divider. And thus, the phase relation between the reference clock signal REF_CLK, PLL clock signal PLL_CLK, and the ADC clock signal is substantially constant from microsleep interval to microsleep interval.

However, as in the case of receiver front end 900, the frequency divider 945 may be a fractional divider. In such case, the synchronizer with phase calibration 550 would not generate the frequency divider PLL clock domain reset signal rst_div_psync at the appropriate time or phase if generating the selected frequency divider reference clock domain reset signal rst_div_rsync$_{sel}$ is based on the reference clock signal REF_CLK directly.

Thus, in order to achieve the appropriate time or phase for the frequency divider PLL clock domain reset signal rst_div_psync, the frequency of the reference clock signal REF_CLK provided to the synchronizer with phase calibration 950 should be divided by an integer M, where M is the least common multiple (LCM) of the frequency of REF_CLK and the frequency of ADC_CLK, divided by the frequency of the ADC_CLK (e.g., M=[LCM(freq_REF_CLK,freq_ADC_CLK)]/freq_ADC_CLK).

In this regard, the receiver front end 900 further includes a frequency divider 960 configured to frequency divide the reference clock signal REF_CLK by M to generate a frequency divided reference clock signal REF_CLK/M, which is provided to the synchronizer with phase calibration 950 similar as in the reference clock signal REF_CLK is provided to the synchronizer with phase calibration 550 of receiver front end 500. Accordingly, the synchronizers 610, 710, and 810 of synchronizer with phase calibrations 600, 700, and 800 would similarly receive the frequency divided reference clock signal REF_CLK/M in place of the reference clock signal REF_CLK. Or, worded differently, all the synchronizers with phase calibrations 550, 600, 700, 800, and 900 may receive frequency divided reference clock signal REF_CLK/M, where M may be one (1) or more.

Figure 10:
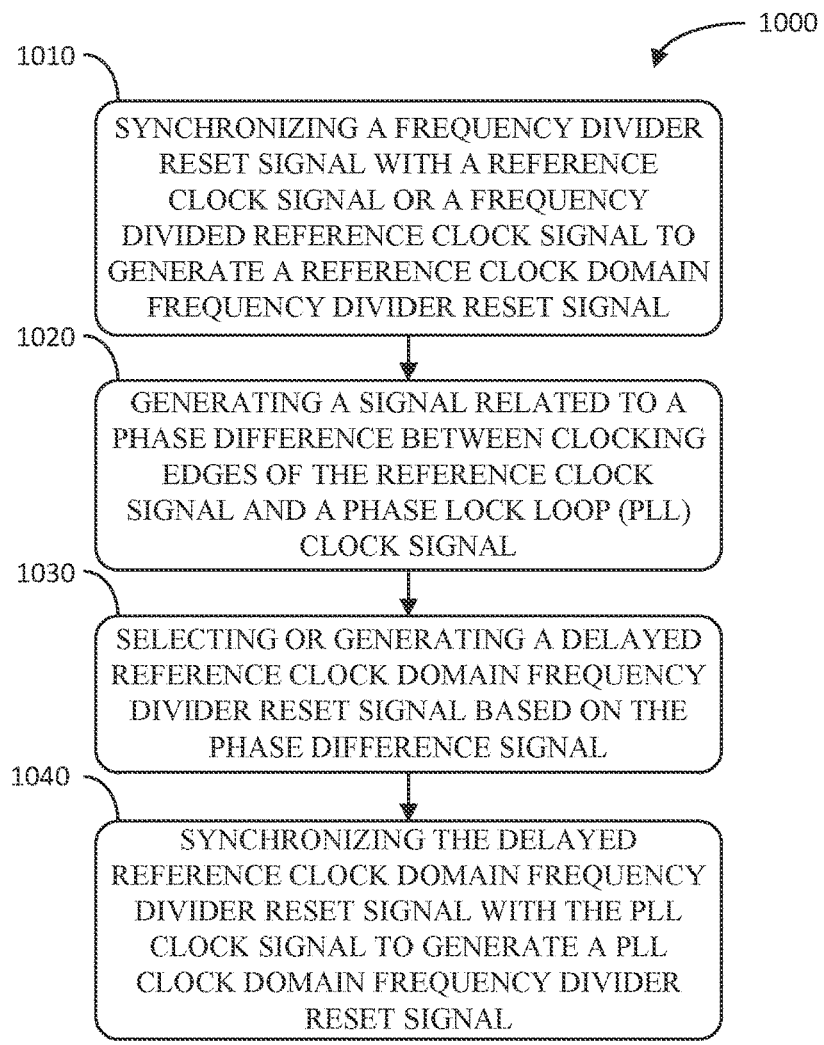
FIG. 10 illustrates a flow diagram of an example method of generating a clock signal in accordance with another aspect of the disclosure.

FIG. 10 illustrates a flow diagram of an example method 1000 of generating a clock signal in accordance with another aspect of the disclosure. The method 1000 includes synchronizing a frequency divider reset signal with a reference clock signal or a frequency divided reference clock signal to generate a reference clock domain frequency divider reset signal (block 1010). Examples of means for synchronizing a frequency divider reset signal with a reference clock signal or a frequency divided reference clock signal to generate a reference clock domain frequency divider reset signal include any of first synchronizers 610, 710, and 810. The method 1000 further includes generating a signal related to a phase difference between clocking edges of the reference clock signal and a phase lock loop (PLL) clock signal (block 1020). Examples of means for generating a signal related to a phase difference between clocking edges of the reference clock signal and a phase lock loop (PLL) clock signal includes any of the phase detectors 620, 720, and 850.

Additionally, the method 1000 includes selecting or generating a delayed reference clock domain frequency divider reset signal based on the phase difference signal (block 1030). Examples of means for selecting or generating a delayed reference clock domain frequency divider reset signal based on the phase difference signal include any of the phase correctors 630, 730, and 860. The method 1000 also includes synchronizing the delayed reference clock domain frequency divider reset signal with the PLL clock signal to generate a PLL clock domain frequency divider reset signal (block 1040). Examples of means for synchronizing the delayed reference clock domain frequency divider reset signal with the PLL clock signal to generate a PLL clock domain frequency divider reset signal includes any of the second synchronizers 640, 740, and 830-1 to 830-6.

The method 1000 may further include selecting the reference clock domain frequency divider reset signal based on the phase difference signal, and synchronizing the reference clock domain frequency divider reset signal with the PLL clock signal to generate the PLL clock domain frequency divider reset signal. An example of means for selecting the reference clock domain frequency divider reset signal based on the phase difference signal includes phase corrector 860. An example of means for synchronizing the reference clock domain frequency divider reset signal with the PLL clock signal to generate the PLL clock domain frequency divider reset signal include second synchronizer 830-0. Further, the method 1000 may include frequency dividing the PLL clock signal in response to a deasserted PLL clock domain frequency divider reset signal, and ceasing the frequency dividing of the PLL clock signal in response to an asserted PLL clock domain frequency divider reset signal. An example of such means for frequency dividing the PLL clock signal and ceasing the frequency dividing of the PLL clock signal include any of the frequency dividers 545 and 945.

The following provides an overview of aspects of the present disclosure:

Aspect 1: An apparatus, comprising: a first synchronizer configured to synchronize a frequency divider reset signal with a reference clock signal or a frequency divided reference clock signal to generate a reference clock domain frequency divider reset signal; a set of delay buffers configured to generate a set of delayed staggered reference clock domain frequency divider reset signals based on the reference clock domain frequency divider reset signal; a set of second synchronizers configured to synchronize the set of delayed staggered reference clock domain frequency divider reset signals with a phase lock loop (PLL) clock signal to generate a set of PLL clock domain frequency divider reset signals; a phase detector configured to generate a phase difference signal related to a phase difference between respective clocking edges of the reference clock signal and the PLL clock signal; a phase corrector configured to generate a select signal based on the phase difference signal; and a multiplexer configured to output one of the set of PLL clock domain frequency divider reset signals based on the select signal.

Aspect 2: The apparatus of aspect 1, wherein the set of second synchronizers are configured to generate the set of PLL clock domain frequency divider reset signals to produce a set of one or more delay vectors in response to one or more clocking edges of the PLL clock signal, wherein the phase detector configured to generate a phase difference signal based on the set of one or more delay vectors.

Aspect 3: The apparatus of aspect 1 or 2, wherein the phase corrector is configured to generate the select signal to reduce a likelihood of the second synchronizer associated with the outputted PLL clock domain frequency divider reset signal becoming metastable compared to another one of the second synchronizer not associated with the outputted PLL clock domain frequency divider reset signal.

Aspect 4: The apparatus of any one of aspects 1-3, wherein the phase corrector is configured to generate the select signal such that a deassertion edge of the reference clock domain frequency divider reset signal associated with the outputted PLL clock domain frequency divider reset signal occurs substantially coincidental with a clocking edge of the PLL clock signal.

Aspect 5: The apparatus of any one of aspects 1-4, wherein the phase corrector is configured to generate the select signal such that a deassertion edge of the reference clock domain frequency divider reset signal meet setup and hold time requirements of the second synchronizer associated with the outputted PLL clock domain frequency divider reset signal.

Aspect 6: The apparatus of any one of aspects 1-5, further comprising a finite state machine (FSM) configured to place the phase detector and phase corrector in at least one calibration state at which the select signal is generated based on the phase difference signal.

Aspect 7: The apparatus of aspect 6, wherein the FSM is configured to place the phase detector and phase corrected in the at least one calibration state in response to a power on reset (POR).

Aspect 8: The apparatus of aspect 6 or 7, wherein the FSM is configured to place the phase corrector in an operational state where the select signal is fixed.

Aspect 9: The apparatus of any one of aspects 1-8, further comprising a frequency divider configured to frequency divide the PLL clock signal to generate an analog-to-digital converter (ADC) clock signal.

Aspect 10: The apparatus of aspect 9, wherein the frequency divider is configured to cease generating the ADC clock signal based on the outputted PLL clock domain frequency divider reset signal being asserted.

Aspect 11: The apparatus of aspect 10, further comprising an analog-to-digital converter (ADC) configured to convert a downlink (DL) analog signal into a DL digital signal based on the ADC clock signal.

Aspect 12: The apparatus of aspect 11, wherein the DL analog signal comprises a set of subframes, and wherein: the frequency divider is configured to generate the ADC clock signal in response to the deasserted outputted PLL clock domain frequency divider reset signal to cause the ADC to convert the DL analog signal into the DL digital signal during first portions of the set of subframes; and the frequency divider is configured to cease generating the ADC clock signal in response to the asserted outputted PLL clock domain frequency divider reset signal to cause the ADC to cease converting the DL analog signal into the DL digital signal during second portions of the set of subframes.

Aspect 13: The apparatus of aspect 12, further comprising: at least one antenna; an analog front end configured to generate the DL analog signal based on a radio frequency (RF) signal received via the at least one antenna; and a digital front end configured to process the DL digital signal.

Aspect 14: The apparatus of any one of aspects 1-13, further comprising a microsleep controller configured to generate the frequency divider reset signal.

Aspect 15: The apparatus of aspect 14, further comprising a phase lock loop (PLL) configured to generate the PLL clock signal based on the reference clock signal.

Aspect 16: The apparatus of aspect 15, wherein the microsleep controller is further configured to generate a PLL reset signal to selectively place the PLL in operational or low power mode.

Aspect 17: The apparatus of any one of aspects 1-16, further comprising a frequency divider configured to frequency divide the reference clock signal by an integer M to generate the frequency divided reference clock signal, where M is a least common multiple (LCM) of the frequency of the reference clock signal REF_CLK and the frequency of the ADC clock signal ADC_CLK, divided by the frequency of the ADC clock signal ADC_CLK.

Aspect 18: An apparatus, comprising: a first synchronizer including a data input configured to receive a frequency divider reset signal and a clock input configured to receive a reference clock signal or a frequency divided reference clock signal; a set of delay buffers including inputs coupled to an output of the first synchronizer; a set of second synchronizers including data inputs coupled to the outputs of the first synchronizer and the set of delay buffers, respectively, and clock inputs configured to receive a phase lock loop (PLL) clock signal; a phase detector including inputs coupled to outputs of the set of second synchronizers, respectively; a phase corrector including an input coupled to an output of the phase detector; a multiplexer including inputs coupled to the outputs of the set of second synchronizers, respectively, and a select input coupled to an output of the phase corrector; and a frequency divider including a reset input coupled to an output of the multiplexer.

Aspect 19: The apparatus of aspect 18, wherein the set of delay buffers are cascaded.

Aspect 20: The apparatus of aspect 18 or 19, further comprising a finite state machine (FSM) coupled to inputs of the phase detector and the phase corrector.

Aspect 21: The apparatus of any one of aspects 18-20, further comprising an analog-to-digital converter (ADC) including a clock input coupled to an output of the frequency divider.

Aspect 22: The apparatus of aspect 21, further comprising: at least one antenna; a receiver analog front end including an input coupled to the at least one antenna, and an output coupled to a signal input of the ADC; and a receiver digital front end including an input coupled to an output of the ADC.

Aspect 23: An apparatus, comprising: a first synchronizer configured to synchronize a frequency divider reset signal with a reference clock signal or a frequency divided reference clock signal to generate a reference clock domain frequency divider reset signal; a phase detector configured to generate a signal related to a phase difference between clocking edges of the reference clock signal and a phase lock loop (PLL) clock signal; a phase corrector configured to select or generate a delayed reference clock domain frequency divider reset signal based on the phase difference signal; and a second synchronizer configured to synchronize the delayed reference clock domain frequency divider reset signal with the PLL clock signal to generate a PLL clock domain frequency divider reset signal.

Aspect 24: The apparatus of aspect 23, wherein: the phase corrector is further configured to select the reference clock domain frequency divider reset signal based on the phase difference signal; and the second synchronizer is further configured to synchronize the reference clock domain frequency divider reset signal with the PLL clock signal to generate the PLL clock domain frequency divider reset signal.

Aspect 25: The apparatus of aspect 23 or 24, wherein the phase detector is configured to generate the phase difference signal based on the reference clock domain frequency divider reset signal and the PLL clock signal.

Aspect 26: The apparatus of any one of aspects 23-25, further comprising a frequency divider configured to: frequency divide the PLL clock signal in response to a deasserted PLL clock domain frequency divider reset signal; and cease the frequency dividing of the PLL clock signal in response to an asserted PLL clock domain frequency divider reset signal.

Aspect 27: A method, comprising: synchronizing a frequency divider reset signal with a reference clock signal or a frequency divided reference clock signal to generate a reference clock domain frequency divider reset signal; generating a signal related to a phase difference between clocking edges of the reference clock signal and a phase lock loop (PLL) clock signal; selecting or generating a delayed reference clock domain frequency divider reset signal based on the phase difference signal; and synchronizing the delayed reference clock domain frequency divider reset signal with the PLL clock signal to generate a PLL clock domain frequency divider reset signal.

Aspect 28: The method of aspect 27, further comprising: selecting the reference clock domain frequency divider reset signal based on the phase difference signal; and synchronizing the reference clock domain frequency divider reset signal with the PLL clock signal to generate the PLL clock domain frequency divider reset signal.

Aspect 29: The method of aspect 27 or 28, wherein generating the phase difference signal is based on the reference clock domain frequency divider reset signal and the PLL clock signal.

Aspect 30: The method of any one of aspects 27-29, further comprising: frequency dividing the PLL clock signal in response to a deasserted PLL clock domain frequency divider reset signal; and ceasing the frequency dividing of the PLL clock signal in response to an asserted PLL clock domain frequency divider reset signal.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
   a first synchronizer configured to synchronize a frequency divider reset signal with a reference clock signal or a frequency divided reference clock signal to generate a reference clock domain frequency divider reset signal;
   a set of delay buffers configured to generate a set of delayed staggered reference clock domain frequency divider reset signals based on the reference clock domain frequency divider reset signal;
   a set of second synchronizers configured to synchronize the set of delayed staggered reference clock domain frequency divider reset signals with a phase lock loop (PLL) clock signal to output a set of PLL clock domain frequency divider reset signals;
   a phase detector configured to generate a phase difference signal related to a phase difference between respective clocking edges of the reference clock signal or the frequency divided reference clock signal and the PLL clock signal;
   a phase corrector configured to generate a select signal based on the phase difference signal; and
   a multiplexer configured to output one of the set of PLL clock domain frequency divider reset signals based on the select signal.

2. The apparatus of claim 1, wherein the set of second synchronizers are configured to generate the set of PLL clock domain frequency divider reset signals to produce a set of one or more delay vectors in response to one or more clocking edges of the PLL clock signal, wherein the phase detector is configured to generate the phase difference signal based on the set of one or more delay vectors.

3. The apparatus of claim 1, wherein the phase corrector is configured to generate the select signal to reduce a likelihood of a second synchronizer of the set of second synchronizers associated with the outputted one of the set of PLL clock domain frequency divider reset signals becoming metastable compared to another second synchronizer of the set of second synchronizers not associated with the outputted one of the set of PLL clock domain frequency divider reset signals.

4. The apparatus of claim 1, wherein the phase corrector is configured to generate the select signal in a manner that a deassertion edge of the reference clock domain frequency divider reset signal associated with the outputted one of the set of PLL clock domain frequency divider reset signals occurs coincidental with a clocking edge of the PLL clock signal.

5. The apparatus of claim 1, wherein the phase corrector is configured to generate the select signal in a manner that a deassertion edge of the reference clock domain frequency divider reset signal meet setup and hold time requirements of a second synchronizer of the set of second synchronizers associated with the outputted one of the set of PLL clock domain frequency divider reset signals.

6. The apparatus of claim 1, further comprising a finite state machine (FSM) configured to place the phase detector and phase corrector in at least one calibration state at which the select signal is generated based on the phase difference signal.

7. The apparatus of claim 6, wherein the FSM is configured to place the phase detector and phase corrected in the at least one calibration state in response to a power on reset (POR).

8. The apparatus of claim 6, wherein the FSM is configured to place the phase corrector in an operational state where the select signal is fixed.

9. The apparatus of claim 1, further comprising a frequency divider configured to frequency divide the PLL clock signal to generate an analog-to-digital converter (ADC) clock signal based on the outputted one of the set of PLL clock domain frequency divider reset signals being deasserted.

10. The apparatus of claim 9, wherein the frequency divider is configured to cease generating the ADC clock signal based on the outputted one of the set of PLL clock domain frequency divider reset signals being asserted.

11. The apparatus of claim 10, further comprising an ADC configured to convert a downlink (DL) analog signal into a DL digital signal based on the ADC clock signal.

12. The apparatus of claim 11, wherein the DL analog signal comprises a set of subframes, and wherein:
   the frequency divider is configured to generate the ADC clock signal in response to the deasserted outputted PLL clock domain frequency divider reset signal to cause the ADC to convert the DL analog signal into the DL digital signal during first portions of the set of subframes; and
   the frequency divider is configured to cease generating the ADC clock signal in response to the asserted outputted PLL clock domain frequency divider reset signal to cause the ADC to cease converting the DL analog signal into the DL digital signal during second portions of the set of subframes.

13. The apparatus of claim 12, further comprising:
   at least one antenna;
   an analog front end configured to generate the DL analog signal based on a radio frequency (RF) signal received via the at least one antenna; and
   a digital front end configured to process the DL digital signal.

14. The apparatus of claim 1, further comprising a microsleep controller configured to generate the frequency divider reset signal.

15. The apparatus of claim 14, further comprising a PLL configured to generate the PLL clock signal based on the reference clock signal.

16. The apparatus of claim 15, wherein the microsleep controller is further configured to generate a PLL reset signal to selectively place the PLL in operational or low power mode.

17. The apparatus of claim 1, further comprising a frequency divider configured to frequency divide the reference clock signal by an integer M to generate the frequency divided reference clock signal, where M is a least common multiple (LCM) of a frequency of the reference clock signal and a frequency of an analog-to-digital converter (ADC) clock signal, divided by the frequency of the ADC clock signal.

18. An apparatus, comprising:
- a first synchronizer including a data input configured to receive a frequency divider reset signal and a clock input configured to receive a reference clock signal or a frequency divided reference clock signal;
- a set of delay buffers including inputs coupled to an output of the first synchronizer;
- a set of second synchronizers including data inputs coupled to outputs of the first synchronizer and the set of delay buffers, respectively, and clock inputs configured to receive a phase lock loop (PLL) clock signal;
- a phase detector including inputs coupled to outputs of the set of second synchronizers, respectively;
- a phase corrector including an input coupled to an output of the phase detector;
- a multiplexer including inputs coupled to the outputs of the set of second synchronizers, respectively, and a select input coupled to an output of the phase corrector; and
- a frequency divider including a reset input coupled to an output of the multiplexer.

19. The apparatus of claim 18, wherein the set of delay buffers are cascaded.

20. The apparatus of claim 18, further comprising a finite state machine (FSM) coupled to another input of the phase detector and another input of the phase corrector.

21. The apparatus of claim 18, further comprising an analog-to-digital converter (ADC) including a clock input coupled to an output of the frequency divider.

22. The apparatus of claim 21, further comprising:
- at least one antenna;
- a receiver analog front end including an input coupled to the at least one antenna, and an output coupled to a signal input of the ADC; and
- a receiver digital front end including an input coupled to an output of the ADC.

\* \* \* \* \*